United States Patent [19]
Yoshikawa et al.

[11] Patent Number: 5,201,961
[45] Date of Patent: Apr. 13, 1993

[54] PHOTOVOLTAIC DEVICE CONTAINING ORGANIC MATERIAL LAYERS AND HAVING HIGH CONVERSION EFFICIENCY

[75] Inventors: Masao Yoshikawa; Tetsurou Suzuki, both of Yokohama, Japan

[73] Assignee: Ricoh Company, Ltd., Tokyo, Japan

[21] Appl. No.: 703,723

[22] Filed: May 21, 1991

[30] Foreign Application Priority Data

May 23, 1990 [JP] Japan .................................. 2-131319

[51] Int. Cl.$^5$ .................... H01L 31/06; H01L 31/0344
[52] U.S. Cl. ................................................. 136/263
[58] Field of Search ........................................ 136/263

[56] References Cited
U.S. PATENT DOCUMENTS

| | | | |
|---|---|---|---|
| 3,057,947 | 10/1962 | Calvin et al. | 136/263 |
| 4,164,431 | 8/1979 | Tang | 136/263 |
| 4,360,703 | 11/1982 | Bolton et al. | 136/263 |
| 4,514,584 | 4/1985 | Fox et al. | 136/263 |
| 5,006,915 | 4/1991 | Yoshikawa et al. | 357/61 |

FOREIGN PATENT DOCUMENTS 2-121371  5/1990  Japan .................... 136/263

OTHER PUBLICATIONS

P. Panayotatos et al., *Conference Record, 19th IEEE Photoroltaic Specialists Conf.* (1987), pp. 889–894.

*Primary Examiner*—Aaron Weisstuch
*Attorney, Agent, or Firm*—Oblon, Spivak, McClelland, Maier & Neustadt

[57] ABSTRACT

The present invention discloses a photovoltaic device comprising a portion containing three layers disposed between two electrodes, at least one of which is light transmittable; wherein said three layers consist of a first layer of organic electron acceptor material, a second layer of organic electron donor material and a third layer of organic electron donor material different from the material of the second layer; or a first layer of organic electron donor material, a second layer of organic electron acceptor material and a third layer of organic electron acceptor material different from the acceptor material of the second layer, the sequence of the three layers being counted from a light incident side; and the device having a high photoelectric conversion efficiency.

8 Claims, 2 Drawing Sheets

PHOTOVOLTAIC DEVICE CONTAINING ORGANIC MATERIAL LAYERS AND HAVING HIGH CONVERSION EFFICIENCY

BACKGROUND OF THE INVENTION

Field of the Invention

The present invention relates to a photovoltaic device comprising three organic layers disposed between two electrodes, of which at least one of said electrodes is light transmittable, wherein the three organic layers consist of and are arranged either as a layer of organic electron acceptor (hereinafter referred to as "OEA") material (a), a layer of organic electron donor (hereinafter referred to as "OED") material (b) and a layer of OED material(c) different from OED material(b); or as a layer of OED material(d), a layer of OEA material (e), and a layer of OEA material(f) different from OEA material (e); arranged in this order from the light-incident side.

Various photovoltaic devices using organic materials as functional materials have hitherto been studied in an attempt to provide an inexpensive and less toxic photovoltaic device which is difficult to obtain by using single crystal, multicrystal or amorphous silicon.

Since the purpose of a photovoltaic device is to convert light energy into electric energy (voltage×current), a primary measure of the device is its conversion efficiency.

To generate a photocurrent, an internal electric field is necessary and several device structures to generate such a field are known. Data on the conversion efficiency of some exemplary device structures composed of organic functional materials are illustrated below.

(1) Schottky junction or MIS junction

In these junctions an internal electric field generated between a metal and a semiconductor is utilized. As organic semiconductor materials, merocyanine dyes, phthalocyanine dyes, etc. have been used.

When white light with an intensity of 78 mW/cm$^2$ was irradiated onto an Al/merocyanine/Ag device, a conversion efficiency of 0.7% (Voc=1.2 V, Jsc=1.8 mA/cm$^2$, ff=0.25) was reported, see A. K. Ghosh, et al. *J. Appl. Phys*, 49, 5982 (1978).

However, organic semiconductors with a high conversion efficiency used in devices of this type are limited to p-type materials. Accordingly, materials of low work function such as Al, In and Mg must be used for the electrode, but, unfortunately, such materials are readily oxidized.

(2) Hetero on junction utilizing n-type inorganic semiconductor/p-type organic semiconductor junction An internal electric field generated upon bonding an n-type inorganic semiconductor and a p-type organic semiconductor is utilized in this junction. CdS, ZnO or the like are used as the n-type material and merocyanine dyes, phthalocyanine dyes, etc. as the p-type organic semiconductor material.

When AM-2 light of 75 mW/cm$^2$ is irradiated onto an indium tin oxide (hereinafter referred to as "ITO"-)/electrochemically deposited CdS/ chloroalminiumphthalocyanine chloride/Au device, the conversion efficiency is 0.22% (Voc=0.69 V, Jsc=0.89 mA/cm$^2$, ff=0.29), see A. Hor et. al., *Appl. Phys. Lett.*, 42, 15 (1983).

(3) A device utilizing organic/organic material hetero junction

An internal electric field generated upon the bonding of an OEA material and an OED material is utilized in this device.

As examples of the OEA material, dyes such as malachite green, methyl violet and pyrylium, and condensed polycyclic aromatic compounds, such as, flavanthrone and perylene pigment are used and as examples of the OED material, phthalocyanine pigments, merocyanine dyes, etc. are used.

When AM-2 light of 75 mW/cm$^2$ is irradiated onto an ITO/copper phthalocyanine/ perylene pigment/Ag device, 0.95% of conversion efficiency (Voc=0.45 V, Jsc=2.3 mA/cm$^2$, ff=0.65) has been reported, see C. Tang, *Appl. Phys. Lett.*, 48, 183 (1986). This value is the highest of the photovoltaic devices employing organic materials so far. Further, in Japanese Patent Publication No. 62-4871 (1987) of the same inventor, 1% of conversion efficiency (Voc=0.44 V, Jsc=3.0 mA/cm$^2$, ff 0.6) has been reported for the device with the same structure but containing a different kind of perylene pigment.

The conversion efficiency of a photovoltaic device using an organic material is lower than that using an inorganic semiconductor. One of the most important reasons for this phenomenon is that the short circuit-photocurrent (herein referred to as "Jsc") is low. When irradiated with white light of 75 mW/cm$^2$, at least 10 mA/cm$^2$ Jsc is necessary. The Jsc value of the device described above is much lower than this. This is ascribed to a low quantum efficiency and a narrow photosensitive wavelength region. The photosensitive wavelength region should preferably extend from 400 nm to longer wavelengths to provide a region as wide as possible; however, photosensitive wavelength regions of commercial devices are often at shorter wavelengths and narrower regions than the desired values.

Furthermore, the fill factor (herein referred to as "ff") is frequently low. Low ff can be attributed to a decrease in the quantum efficiencies exhibited by an organic semiconductor at low electric field. Therefore, to improve the ff value, it is preferable to develop a device consisting of a structure which can form an intense internal electric field and does not suffer a decrease in efficiency. Further, ff will be increased if a device structure is constructed in which formed carriers can easily reach an electrode without an energy barrier. That will lead to an improvement in the open circuit voltage (herein referred to as "Voc"), but so far these factors have not been sufficiently considered.

Additionally, most conventional photovoltaic devices employing organic layers are beset with several problems, such as, the chemical instability of the electrode material.

Bearing in mind the points described above, known device structures (1), (2) and (3) described before will again be considered.

(1) Schottky junction or MIS junction

Although a Voc as high as 1 volt can be obtained, the light transmission of the electrode is low, because of the necessary metal electrode. Actual light transmittance is 30% at best and is usually about 10%. In addition, the materials are poor in oxidation resistance. Accordingly, high conversion efficiency and stable characteristics are not obtained with this device structure.

(2) Inorganic semiconductor/organic semiconductor hetero pn junction

Since photocarriers are mainly formed in an organic material layer, such a junction cannot avoid a limitation due to its photosensitivity. This limitation results because an organic material layer is usually formed with a single material and because an organic semiconductor having an intense absorption, from 400 to, for instance, 800 nm wavelength does not exist at present. Accordingly, although the device of this structure can overcome the problems of light transmittance of an electrode on a light-incident side and the stability of the electrode, high conversion efficiency cannot be achieved because of its narrow photosensitive wavelength region.

(3) Organic material/organic material hetero pn junction

This junction is the most desirable one at present relative to the two other structures described above. Light can be irradiated through a transparent electrode and, as photocarriers can be formed in an interfacial region existing in the two different layers, the photosensitivity region can also be widened. Actually, it can be assumed from Tang's report described above that carriers are formed by the perylene pigments at 450–550 nm wavelength and by copper phthalocyanine at 550–700 nm wavelength. Further, since the ff is greater than with other device structures, one can assume that a high internal electric field is formed. However, Tang's device does have some disadvantages.

One disadvantage is the occurence of pinholes due to the thinness of the organic material layer (it is described in the patent that a thickness of 300 to 500 Å is desirable). Also in our experiment, short circuits between two electrodes possibly attributable to pinholes are observed with relatively high frequencies. Also, the electrode area is described as 0.1 cm$^2$ in Tang's report and a significant problem will arise regarding the low yield of the device in the case of practical use which requires an electrode having an area larger than 1 cm$^2$.

A second disadvantage concerns the electrode material. In Tang's invention, the electrode must be in ohmic contact with each of the organic layers. Also in his report, it is described that the Voc is reduced in a device structure, in which the sequence order of organic layers is reversed. This is estimated to be attributable to a deterioration of the ohmic contact described in his invention. On the other hand, in a device structure in which the ohmic contact is sufficient, there is another problem with the stability of the metal material of the electrode, because a metal having an ohmic contact with an OEA material will necessarily have a low work function. Actually, In, Ag, Sn and Al are exemplified in the patent literature, all of which are readily oxidized.

The present inventors have undertaken a program of research directed to obtaining a device structure which can overcome the disadvantages of a photovoltaic device having organic layers and which has a relatively high conversion efficiency as an organic photovoltaic device. The inventors have discovered that a device having the following structure can meet these aims: a photovoltaic device containing a portion comprising three organic layers disposed between two electrodes, of which at least one of said electrodes is light transmittable, wherein the three layers consist of and are arranged as a layer of OEA material (a), a layer of OED material (b) and a layer of OED material (c) different from OED material (b); or as the same three layers except that an OEA material is to be read as an OED material and an OED material as an OEA material, respectively; arranged in this order from the light-incident side.

Based on these findings, they have completed the present invention.

BRIEF DESCRIPTION OF THE DRAWINGS

In the drawings, reference numerals denote the following:
1: layer of OEA material (a)
2: layer of OED material (b)
3: layer of OED material (c)
4: transparent electrode
5: back side electrode
6: transparent and insulative support
7: lead wire
8: transparent n-type inorganic semiconductor layer
9: layer of OED material (d)
10: layer of OEA material (e)
11: layer of OEA material (f)

SUMMARY OF THE INVENTION

One object of the present invention is to provide a photovoltaic device containing a portion comprising three organic layers disposed between two electrodes, of which at least one of said electrodes is light transmittable; wherein the three layers consist of and are arranged either as a layer of OEA material(a), a layer of OED material (b) and a layer of OED material (c) different from OED material (b); or as three layers (d), (e) and (f), except that an OEA material is to be read as an OED material and an OED material as an OEA material respectively; arranged in this order from the light-incident side.

Another object of the present invention is to provide a photovoltaic device, wherein an n-type inorganic semiconductor layer is placed between a light transmittable electrode and an organic layer or between a back side electrode and an organic layer in addition to the component comprising the three organic layers described above.

A further object of the present invention is to provide an organic material photovoltaic device having high values of Voc, Jsc and ff and possessing superior photoelectronic conversion efficiency as a result of the device structure.

DETAILED DESCRIPTION OF THE PREFERRED EMBODIMENTS

Explanation will now be made of structures of the device, materials used and method of fabrication of the present invention.

Figure 1:
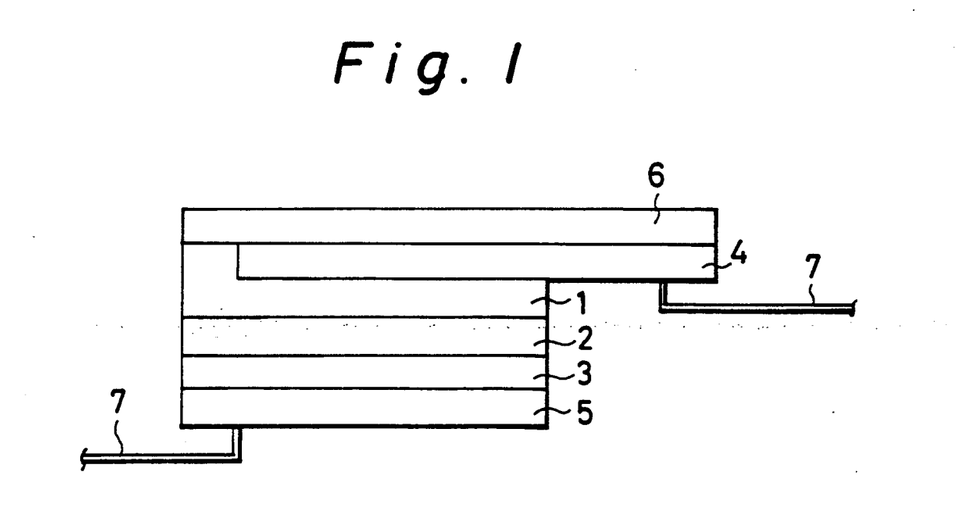
FIGS. 1 to 4 are, respectively, schematic views illustrating specific examples of the device structure according to the present invention.

One embodiment of the photovoltaic device of the present invention is shown in FIG. 1. In this case, a support can also be placed on a side of a back side electrode.

Figure 2:
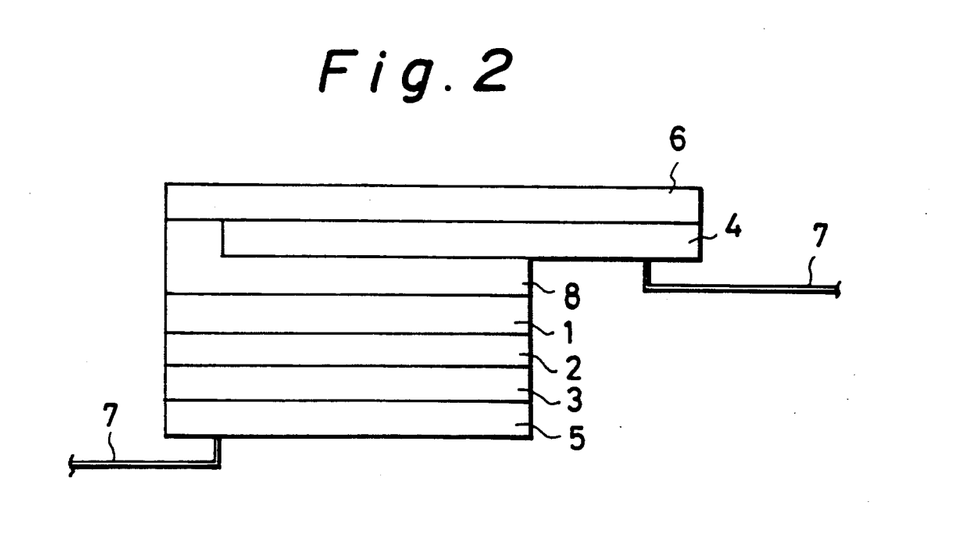

FIG. 2 shows another and more preferable device structure of the present invention. The difference between FIGS. 1 and 2 is that a light transmittable n-type inorganic semiconductor layer is interposed in FIG. 2.

Figure 3:
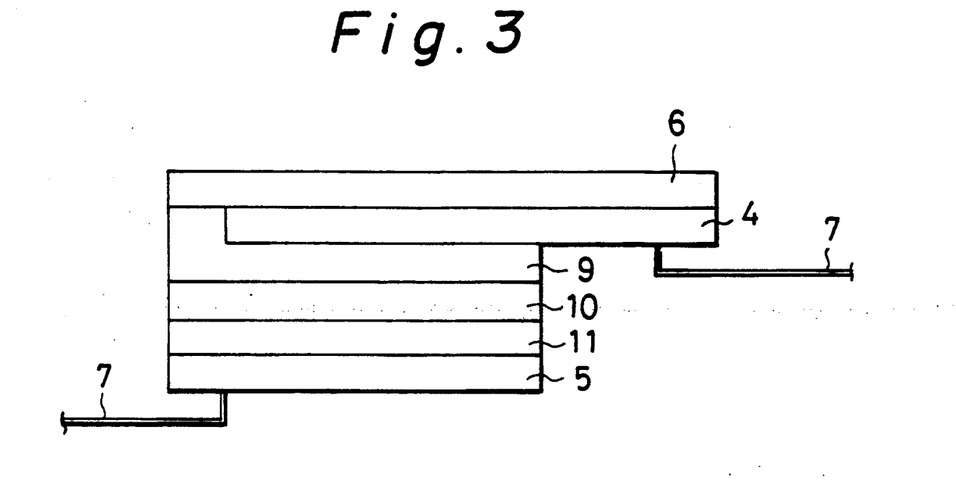

FIG. 3 shows still another embodiment of the photovoltaic device according to the present invention.

Figure 4:
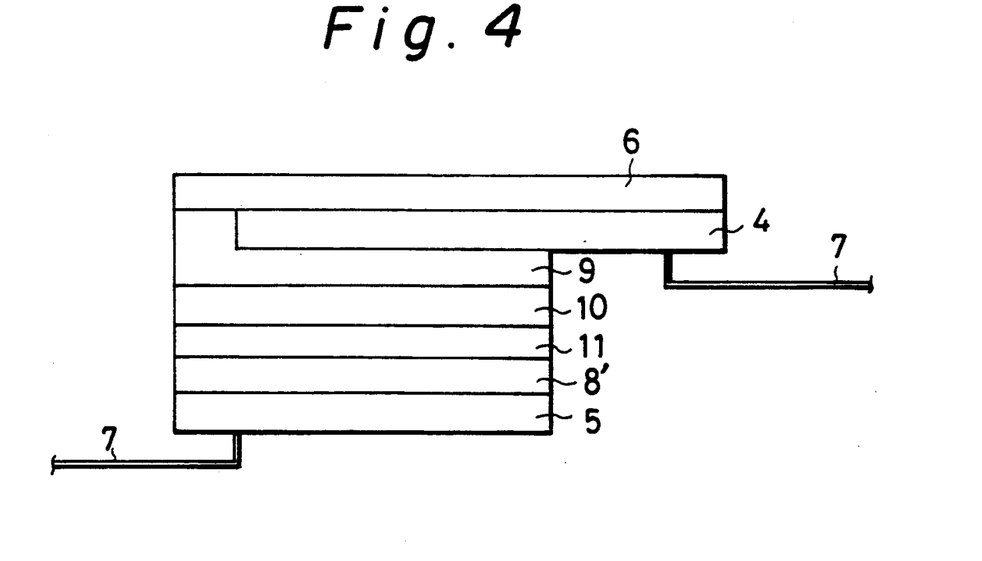

FIG. 4 shows still another embodiment of the present invention.

The difference between FIGS. 3 and 4 is that an n-type inorganic semiconductor layer is interposed in FIG. 4.

The improved characteristics exhibited by the device structures of FIGS. 1 to 4 are considered to be attributable to common factors among them. Therefore, description will be given as to the device structure shown in FIG. 2, which is representative of the device according to the present invention.

One feature of the device structure of the present invention resides in that a layer of OEA material (a) (hereinafter referred to as "layer a"), a layer of OED material (b) (hereinafter referred to as "layer b"), and a layer of OED material (c) (hereinafter referred to as "layer c") are all laminated. It has been found that the Jsc is particularly improved with this structure than with a structure in which only layer a and layer b are laminated.

Although it is not clear why such an increase in the Jsc is obtained, it has been found that the photocarrier forming site is present at the interface between layer a and layer b, with no particular difference from the structure without layer c, and that the Jsc is increased because of a remarkable increase in the photocurrent formed in layer b. Further, the thickness of layer b should be within a certain range, for, if the thickness is too large, then the Jsc is lowered. In view of the above, the following reasons are assumed for the increase of Jsc.

(a) The portion of layer b in which photocarriers are formed (hereinafter referred to as "photo active site") is at the interface in contact with layer a. If its thickness is within an appropriate range for increasing the Jsc and is, for example, from 100 to 200 Å, then an electric short-circuit is caused in a device structure without layer c. If the thickness of layer b is increased to avoid the short-circuit, then the portion not contributing to the formation of the photocarriers (hereinafter referred to as "photo inactive site") increases.

On the other hand, since the thickness of the photo active site is thin as described above, light absorption in this region is incomplete and a considerable portion of the light reaches the photo inactive site and is wastefully absorbed in this region. When the photo inactive site layer is replaced with layer c made of a material different from (b), electric short-circuiting can be prevented. Further, since the incident light at a wavelength which is absorbed in the photoactive site of layer b to form photocarriers is not absorbed in layer c as in layer b, it is reflected at the back side electrode and not suffering significant decay, then contributes again to a formation of photocarriers in the photo active site. As a result, in the structure having layer c, the amount of light absorbed in the light active site in layer b is increased.

In the present invention, the term "layer c made of a material different from that of layer b" means that the absorption wavelength region of layer b does not completely overlap with that of layer c.

It is preferable that the difference between the wavelengths of the absorption peaks for layer b and for layer c is not less than 20 nm.

(b) Of the photocarriers formed in layer b, the positive carriers are immediately injected in layer c. Accordingly, the recombination between holes and electrons generated in layer b is decreased, resulting in an improved quantum efficiency.

Furthermore, the presence of an n-type inorganic semiconductor layer results in an improvement of the conversion efficiency and reduction of short-circuiting is achieved as a result of the improvement of Voc, Jsc and ff. Although the exact reason why such effect is caused by the n-type inorganic semiconductor layer is not clear at present, it is assumed to be as follows:

(1) Improvement of the conversion efficiency (a) As a transparent electrode, a material with a low Fermi level, such as ITO is conventionally used. Therefore, if the n-type inorganic semiconductor layer is not present, a Schottky junction is formed between layer a and the transparent electrode. This junction works as an energy barrier when electrons move from layer a to the transparent electrode. If the n-type inorganic semiconductor layer is present, the contact between each of transparent electrode/n-type inorganic semiconductor layer and n-type inorganic semiconductor layer/layer a can be an ohmic contact. In this case, different from the case in which the electrode and the organic layer are in direct ohmic contact, electrons can move smoothly due to the presence of the n-type inorganic semiconductor layer therebetween.

(b) Since the occurence of short-circuits can be lowered, the thickness of the organic layer can be reduced, leading to an improvement in the quantum efficiency.

(c) Electrons are supplied in the dark from the n-type inorganic semiconductor layer to layer a and the internal electric field formed at the interface between layers a and b is strengthened.

(2) Reduction of short-circuits (a) A difference of levels at the edge portion of the transparent electrode (usually greater than about 1000 Å in the case of using ITO) is moderated due to the presence of the n-type inorganic semiconductor layer, and the occurrence of short-circuits between both electrodes is reduced in this portion.

(b) For instance, even if pinholes are present in layer a, layer b adjacent thereto forms a pn junction with the n-type inorganic semiconductor layer, and eliminates the effect of the pinholes in layer a. Also when pinholes are present in layer b, a similar result is obtained between the back side electrode and layer a. Accordingly, short-circuits are scarcely observed.

Although the foregoing explanations have been addressed to the structure shown in FIG. 2, it will be readily understood that the Jsc is also increased in the structure shown in FIG. 1. Further, regarding the structures shown in FIGS. 3 and 4, the same effect can be explained in the same manner while replacing the layer of OEA material and the layer of OED material in the foregoing explanations, respectively, with the layer of OED material and the layer of OEA material and, further, by replacing positive carriers with electrons.

Next, various kinds of materials used for the photovoltaic devices of the present invention and a fabrication method therefor will be explained.

As a transparent insulative support used in the present invention, glass or plastic films can be used.

As a transparent electrode used in the present invention, ITO, tin oxide, indium oxide, zinc oxide, and semitransparent Au and the like can be used. The preferred thickness of the materials is 100 to 10,000 Å.

As the n-type semiconductor layer in the present invention, for example, zinc oxide, zinc oxide doped with a trivalent metal, CdS, titanium oxide, amorphous silicon doped with phosphorus and n-type crystalline silicon can be used. Among them, zinc oxide, trivalent metal-doped zinc oxide, CdS or titanium oxide is used when a transparent electrode is required. The thickness is from 10 to 10,000 Å when light transmission is necessary and it can be thicker when light transmission is not necessary.

As the OEA material used in the present invention as layers a, e and f, there can be mentioned, for example, the following:

Perylene series pigment: Pigment Red (hereinafter referred to as "PR") 179; PR 190; PR 149; PR 123; Pigment Brow 265; etc.

Perynone series pigment: Pigment Orange 43; PR 194; etc.

Anthraquinone series pigment: PR 168; PR 177; Vat Yellow 4; etc.

Quinone-containing yellow pigment such as flavanfuran,

Dyes such as crystal violet; methyl violet and malachite green; etc. and acceptor compounds such as fluorenone; 2,4,7-trinitro-fluorenone; tetracyanoquinodimethane and tetracyanoethylene.

They are formed into a film by vapor deposition, spin coating or dipping. To make a thin, homogenous film, vapor deposition is preferable. The preferred thickness of the film is 100 to 3,000 Å.

As the OED material used in the present invention as layers b, c and d, there can be mentioned, for example, the following: phthalocyanine series pigments (those having bivalent central metals such as Au, Zn, Co, Ni, Pb, Pt, Fe, and Mg; metal free phthalocyanines; phthalocyanines having trivalent metals with coordinated halogen atoms, such as aluminum chlorophthalocyanine, indium chlorophthalocyanine, and gallium chlorophthalocyanine; chlorinated copper phthalocyanine; chlorinated zinc phthalocyanine; as well as oxygen-coordinated phthalocyanine such as vanadyl phthalocyanine and titanyl phthalocyanine);

Indigo, thioindigo series pigment (Pigment Blue 66, Pigment violet 36, etc.);

Quinacridone series pigment (Pigment Violet 19, Pigment Red 122, etc.);

Dyes, such as, merocyanine compounds, cyanine compounds and squalium compounds;

High molecular material having $\pi$-electron conjugation and high molecular material having $\pi$-electron conjugation containing lone pair electrons (for example, nitrogen lone pair), are shown below as examples:

Polyacetylenes, polydiacetylenes;

Heterocyclic polymers such as polythiophene, poly(substituted thiophene), polypyrrole, poly(substituted pyrrole), polyfuran, poly-(substituted furan), polyindole and polycarbazole;

Amine type polymers such as polyaniline, poly(substituted aniline), polydiphenylamine, poly(N,N'-diphenylbenzidine), polydiaminonaphthalene, polytriphenylamine and polyaminopyrene;

Condensed ring polymers and condensed polycyclic polymers such as poly-p-phenylene and polyazulene.

These conjugated polymers can be synthesized by chemical polymerization or electrochemical polymerization.

Charge transport agents used in organic electrophotographic light sensitive bodies, such as, hydrazone compounds, pyrazoline compounds, triphenylmethane compounds, triphenylamine compounds, styryl compounds, benzodithiol series compounds, oxadiazole compounds, oxazole compounds, and polyvinyl alcohols. Electron donative compounds used in electroconductive organic charge transfer complexes, such as, tetrathioflavalene and tetraphenyl tetrathioflavalene.

In an embodiment combining different kinds of OED material layers b and c in the present invention, phthalocyanine is particularly preferable as the material of layer b.

With phthalocyanine as layer b:

(1) a good pn junction is formed in contact with layer a, by which the intense internal electric field necessary for a generation of photocurrent is formed;

(2) since the photoconductive effect is high among many OED materials, a high quantum efficiency can be obtained;

(3) phthalocyanine can also absorb light at wavelengths longer than 600 nm. On the other hand, many OEA materials absorb light only of wavelengths shorter than 600 nm. Accordingly, a photocurrent can be formed over the entire visible light region from short wavelengths to long wavelengths at the organic material pn interface which is a photocurrent-generation site and, as a result, wide photosensitivity can be realized;

(4) since phthalocyanine is stable to heat and light, a highly durable device can be obtained;

(5) since thin films of 100 to 300 Å thickness with good quality can be obtained easily by vacuum vapor deposition, particularly desirable conditions for forming a thin film in this device structure can be satisfied; and (6) since many central metals can be used and, further, various crystal forms exist for one material, wide selection of various materials can be realized according to the necessary performance.

Further, in layer c of the present invention, both the crystalline and the amorphous phase of molecular arrangement can exhibit excellent but different functions.

When layer c exists in a crystalline phase, a high hole drift mobility can be expected in the layer and it can also be expected that loss of an internal electric field in layer b due to the formation of space charges is low, and a reduction of the quantum efficiency does not occur.

Further, it is expected that when layer c exists in an amorphous phase, the contact resistance between layers b and c is lowered because of an improvement in contact of the two layers and the resistance of the device is reduced since a reduction of thickness of layer c can be promoted because of a low occurence of pinhole generation in the layer.

Whether the phase is crystalline or amorphous can be confirmed by observing a film, prepared on a glass substrate, with a polarization microscope under cross Nichol.

Referring to the materials described above, phthalocyanine series pigments, indigo or thioindigo series pigments, and quinacridone series pigments are stable in a crystalline phase and can form a film of a specific crystal form, for example, by vapor deposition. Further, merocyanine compounds, cyanine compounds, squalium compounds and charge transfer agents used in electrophotography often form an amorphous molecular arrangement when fabricated into a film by a vapor deposition method.

As a preferable combination for layers b and c, phthalocyanine series pigments including metal-free phthalocyanine/quinacridone series pigments; phthalocyanine series pigments/ merocyanine compounds; phthalocyanine series pigments/cyanine compounds; phthalocyanine series pigments/squalium compounds; indigo series pigments/quinacridone pigments; phthalocyanine series pigments/charge transport agents and quinacridone series pigments/charge transport agents can be exemplified.

A particularly preferable example of the crystalline materials of layer c used in the present invention is quinacridone series pigments. For instance, there can be mentioned:
non-substituted quinacridone;
2,9-dichloroquinacridone;
3,10-dichloroquinacridone;
4,11-dichloroquinacridone;
3,4,10,11-tetrachloroquinacridone;
2,4,9,11-tetrachloroquinacridone;
1,2,8,9-tetrachloroquinacridone;
1,2,4,8,9,11-hexachloroquinacridone;
1,4,8,11-tetrafluoroquinacridone;
2,4,8,11-tetraiodoquinacridone;
2,9-dimethylquinacridone;
3,10-dimethylquinacridone;
4,11-dimethylquinaoridone;
3,4,10,11-tetramethylquinacridone;
2,4,9,11-tetramethylquinacridone;
1,2,8,9-tetramethylquinaoridone;
1,4,8,11-tetramethylquinacridone;
2,9-dimethoxyquinacridone;
3,10-dimethoxyquicridone; and
4,11-dimethoxyquinacridone.

As a particularly preferable amorphous material of layer c used in the present invention, hydrazone compounds, pyrazoline compounds, triphenylmethane compounds, triphenylamine compounds and styryl compounds, each having an alkylamino group or an arylamino group, can be exemplified.

These layers can be formed as films, for example, by vapor deposition, spin coating, dipping and electrochemical polymerization. Among them, vapor deposition is most preferable to obtain a thin, uniform film.

The appropriate film thickness is 30 to 300 Å for layer b. If it becomes too thick, no increase is obtained for Jsc. On the other hand, if it is too thin, the light absorption of the layer itself is lowered and Jsc is reduced. An appropriate film thickness for layer c is from 50 to 10,000 Å.

As the back side electrode of the present invention, when it is in contact with the OED material layer, metals with high work function such as Au, Pt, Ni, Pd, Cu, Cr, and Ag, and when it is in contact with the OEA material layer, Al, In, Pb, Zn, Mg, and Ag can be used. Further, when the electrode is in contact with the n-type inorganic semiconductor layer, all the metals described above, can be used. The thickness of the metal film is preferably 50 to 3,000 Å.

EXAMPLES

The present invention will now be explained more specifically referring to the following examples.

EXAMPLE 1

Zinc oxide was deposited on an ITO glass substrate (30 Ω/□, manufactured by MATSUZAKI SHINKU, Co.), being cleaned well and kept at a temperature of about 250° C., as a thin film of a thickness about 1,500 Å, by an RF magnetron sputtering method using argon as the sputtering gas.

Then, a film of about 400 Å perylene tetracarboxylic acid bismethylimide (hereinafter referred to as "PLME"), which is an electron acceptor material, a film of about 100 Å chloroaluminumphthalocyanine (hereinafter referred to as "AlClPc"), which is an electron donor material, and a film of about 300 Å quinacridone (hereinafter referred to as "QA"), which is a electron donor material, were successively disposed thereover by means of vacuum deposition, and gold was further vacuum deposited thereover. The area of contact of ITO with gold was set to 0.25 cm². Lead wires were attached with a silver paste to two electrodes.

When the conversion efficiency was measured by irradiating with white light of an intensity of 75 mW/cm² through the side of the ITO layer of the device and applying a voltage swept at 6 mV/s, Voc=0.48 V, Jsc=3.1 mA/cm² and ff=0.48 were measured and 0.95% of conversion efficiency was obtained. The value is large for an organic photovoltaic device.

COMPARATIVE EXAMPLE 1

A device was fabricated by the procedures of Example 1, except the thickness of the AlClPc layer was changed to 400 Å and the QA layer was not used and the conversion efficiency was measured. As a result, Voc=0.43 V, Jsc=2.44 mA/cm² and ff=0.46 were obtained and the conversion efficiency was 0.65%.

EXAMPLE 2

A device was fabricated by the procedures of Example 1 except that AlClPc was replaced with metal-free phthalocyanine (hereinafter referred to as H₂Pc) and the thickness of the film was changed to 200 Å and the conversion efficiency was measured. As a result, Voc=0.37 V, Jsc=2.0 mA/cm² and ff=0.51 were obtained and the conversion efficiency was 0.5%.

COMPARATIVE EXAMPLE 2

A device was fabricated by the procedures of Example 2 except the thickness of the H₂Pc layer was changed to 300 Å and the QA layer was not used and the conversion efficiency of the device was measured. As a result, Voc=0.37 V, Jsc=1.6 mA/cm² and ff=0.51 were obtained and the conversion efficiency was 0.4%.

EXAMPLE 3

A device was fabricated by the procedures of Example 1 except the thickness of the PLME layer was changed to 500 Å and the AlClPc layer was replaced with a titanyl phthalocyanine (hereinafter referred to as TiOPc) layer having a thickness of 120 Å and the conversion efficiency was measured. As a result, Voc=0.5 V, Jsc=2.6 mA/cm² and ff=0.46 were obtained and the conversion efficiency was 0.8%.

COMPARATIVE EXAMPLE 3

A device was fabricated by the procedures of Example 3 except the thickness of the TiOPc layer was changed to 300 Å and the QA layer was not used and the conversion efficiency was measured. As a result, Voc=0.5 V, Jsc=1.7 mA/cm² and ff=0.46 were obtained and the conversion efficiency was 0.52%.

EXAMPLE 4

A device was fabricated by the procedures of Example 3 except the zinc oxide layer was not used and the conversion efficiency was measured. As a result, Voc=0.42 V, Jsc=2.1 mA/cm² and ff=0.46 were obtained and the conversion efficiency was 0.54%.

COMPARATIVE EXAMPLE 4

A device was fabricated by the procedures of Example 4, except the thickness of the TiOPc layer was changed to 300 Å and the QA layer was not present and the conversion efficiency was measured. As a result, Voc=0.46 V, Jsc 1.6 mA/cm² and ff=0.41 were obtained and the conversion efficiency was 0.4%.

EXAMPLE 5

A device was fabricated by the procedures of Example 1 except the AlClPc layer was replaced with a copper phthalocyanine layer having a thickness of 200 Å, and the conversion efficiency was measured. As a result, Voc=0.39 V, Jsc=1.9 mA/cm² and ff=0.58 were obtained and the conversion efficiency was 0.57%.

EXAMPLE 6

A device was fabricated by the procedures of Example 1 except the AlClPc layer was replaced with a zinc phthalocyanine (hereinafter simply referred to as "ZnPc") layer having a thickness of 200 Å, and the conversion efficiency was measured. As a result, Voc=0.35V, Jsc=1.8 mA/cm² and ff=0.49 were obtained and the conversion efficiency was 0.41%.

EXAMPLE 7

A device was fabricated by the procedures of Example 1 except the AlClPc layer was replaced with a lead phthalocyanine layer having a thickness of 160 Å, and the conversion efficiency was measured. As a result, Voc=0.36 V, Jsc=2.5 mA/cm² and ff=0.54 were obtained and the conversion efficiency was 0.65%.

EXAMPLE 8

A device was fabricated by the procedures of Example 1 except the AlClPc layer was replaced with a chlorinated zinc phthalocyanine layer having a thickness of 200 Å, and the conversion efficiency was measured. As a result, Voc=0.43 V, Jsc=1.3 mA/cm² and ff=0.55 were obtained and the conversion efficiency was 0.31%.

EXAMPLE 9

A device was fabricated by the procedures of Example 1 except the thickness of the AlClPc layer was changed to 120 Å and the QA layer was replaced with a 2,9-dimethylquinacridone layer. When the conversion efficiency of the device was measured in the same manner as in Example 1, Voc=0.48 V, Jsc=3.5 mA/cm², ff=0.49 and 1.1% conversion efficiency were obtained.

EXAMPLE 10

A device was fabricated by the procedures of Example 1 except the thickness of the PLME layer was changed to 450 Å and the QA layer was replaced with a layer of pyrazoline compound of the following formula having a thickness of 400 Å. When the conversion efficiency of the device was measured in the same manner as in Example 1, Voc=0.47 V, Jsc=2.7 mA/cm², ff=0.46 and 0.78% conversion efficiency were obtained.

EXAMPLE 11

A device was fabricated by the procedures of Example 10 except the thickness of the pyrazoline compound layer was changed to 200 Å. Two electrodes of the device were short-circuited and monochromatic light having a wavelength of 740 nm with an intensity of 30 μA/cm² was irradiated from a side of ITO. A photocurrent Jsc of 4.6 μA/cm² was obtained and the quantum yield calculated from the Jsc value was 29%.

COMPARATIVE EXAMPLE 5

When the same measurement as in Example 11 was performed on the device of Comparative Example 1, the value for the short-circuit photocurrent Jsc was 2.8 μA/cm².

EXAMPLE 12

A device was fabricated by the procedures of Example 10 except the layer of pyrazoline compound was replaced with a layer of phenylene diamine compound of the following formula having a thickness of 300 Å. As a result Voc=0.47, V, Jsc=2.6 ma/cm², ff=0.47 were obtained and the conversion efficiency was 0.77%.

EXAMPLE 13

A device was fabricated by the procedures of Example 10 except the layer of pyrazoline compound was replaced with a layer of hydrazone compound of the following formula having a thickness of 400 Å, and the conversion efficiency was measured. As a result, Voc=0.47 V, Jsc=2.5 mA/cm², ff=0.46 and 0.72% conversion efficiency were obtained.

EXAMPLE 14

A device was fabricated by the procedures of Example 10 except the layer of pyrazoline compound was replaced with a layer of carbazole compound of the following formula having a thickness of 700 Å, and the conversion efficiency was measured. As a result, Voc=0.49 V, Jsc=2.6 mA/cm², ff=0.43 and 0.73% conversion efficiency were obtained.

EXAMPLE 15

A device was fabricated by the procedures of Example 10 except the film thickness of the PLME layer was changed to 600 Å and the layer of AlClPc was replaced with a layer of TiOPc having a thickness of 120 Å, and the conversion efficiency was measured. As a result, Voc=0.5 V, Jsc 2.0 mA/cm², ff=0.45 and 0.6% conversion efficiency were obtained.

EXAMPLE 16

A device was fabricated by the procedures of Example 15 except the zinc oxide layer was not present, and the conversion efficiency was measured. As a result, Voc=0.45 V, Jsc=2.2 mA/cm², ff=0.43 and 0.57% conversion efficiency were obtained.

EXAMPLE 17

On the ITO glass as used in Example 1, were vapor deposited QA-ME in a thickness of 300 Å, then a pigment 1 which is a mixture of the perylene series pigments of the following formulae in a thickness of 200 Å and thereover, a pigment 2 of the following formula in a thickness of 200 Å. Finally, silver was disposed by vapor deposition as a back side electrode. When the conversion efficiency of this device was measured in the same manner as in Example 1, Voc=0.39 V, Jsc=1.8 mA/cm², ff=0.29 and 0.27% conversion efficiency were obtained.

COMPARATIVE EXAMPLE 6

A device was fabricated by the procedure of Example 17 except the thickness of the layer of the pigment 1 was changed to 300 Å and the layer of pigment 2 was not present and the conversion efficiency was measured. As a result, Voc=0.42 V, Jsc=1.2 mA/cm², ff=0.21 and 0.14% conversion efficiency were obtained.

EXAMPLE 18

The pigment 2 in Example 17 was replaced with the following pigment 3 and a layer of zinc oxide was disposed thereover in thickness of 1,500 Å in the same manner as in Example 1. In this case, the substrate was not heated intentionally. Finally, a layer of silver was disposed by vapor deposition as a back side electrode. When the conversion efficiency of this device was measured in the same manner as in Example 1, Voc=0.51 V, Jsc=2.1 mA/cm², ff=0.45 and 0.64% of conversion efficiency were obtained.

Pigment 3:

Pigment 1 (Mixture):

Pigment 2:

-continued

EXAMPLE 19

N,N'-diphenylbenzidine (3.5 mmol/l) and tetrabutyl ammonium perchlorate (hereinafter referred to as "TBAP") (0.1 mmol/l) were dissolved in acetonitrile and electrochemically polymerized on the ITO glass as used in Example 1 at a potential of 1.5 V relative to a saturated calomel electrode (hereinafter referred to as "SCE") for 7 seconds, using a Pt plate as a counter electrode. The resultant film was electrochemically undoped at 0.5 V relative to the SCE and sufficiently cleaned with methanol. As a result, a poly(N,N'-diphenylbenzidine) with a film thickness of about 900 Å was obtained.

On the ITO glass having the film of the polymer on its surface, a layer of AlClPc with a thickness of about 100 Å and a layer of PLME with a thickness of about 150 Å were deposited by a vacuum vapor deposition and, further, zinc oxide was disposed at a thickness of about 1,500 Å in the same manner as in Example 18. Finally, gold was vapor deposited under vacuum. When the conversion efficiency of the device was measured in the same manner as in Example 1, Voc=0.45 V, Jsc 2.65 mA/cm$^2$, ff=0.46 and 0.7% conversion efficiency were obtained.

EXAMPLE 20

A device was fabricated by the procedures of Example 19 except the layer of the electron donor material AlClPc was replaced with a layer of ZnPc having a thickness of 120 Å, and the conversion efficiency was measured. As a result, Voc=0.35 V, Jsc=1.4 mA/cm$^2$, ff=0.45 and 0.29% conversion efficiency were obtained.

EXAMPLE 21

A device was fabricated by the procedures of Example 19 except the layer of the electron donor material was replaced with a layer of H$_2$Pc having a thickness of 100 Å, and the conversion efficiency was measured. As a result, Voc=0.42 V, Jsc=1.8 mA/cm$^2$, ff=0.5 and 0.5% conversion efficiency were obtained.

EXAMPLE 22

A device was fabricated by the procedures of Example 19 except the layer of the electron donor material was replaced with a layer of QA having a thickness of 100 Å, and the conversion efficiency was measured. As a result, Voc=0.57 V, Jsc=0.95 mA/cm$^2$, ff=0.60 and 0.43% conversion efficiency were obtained.

EXAMPLE 23

Pyrrole (0.1 mol/l) and TBAP (0.1 mol/l) were dissolved in acetonitrile and a polypyrrole film of about 600 Å thickness was formed on a glass substrate, vapor deposited with gold, by the constant potential polymerization method. After sufficiently cleaning the film with acetone, a layer of AlClPc of 90 Å thickness and a layer of PLME of 350 Å thickness were successively deposited on the polypyrrole film by a vacuum vapor deposition. A ZnO layer (1,300 Å thickness) and an ITO layer were further deposited thereover. The conversion efficiency was measured for the device in the same manner as in Example 1. As a result, Voc=0.46 V, Jsc=2.72 mA/cm$^2$, ff=0.45 and 0.75% of conversion efficiency were obtained.

EXAMPLE 24

Aniline was subjected to chemical oxidative polymerization by using peroxoammonium disulfate as an oxidizer under an acidic condition with sulfuric acid. The resultant polyaniline was undoped with an aqueous ammonia and then washed with water sufficiently. It was dissolved into N-methylpyrrolidone to prepare a coating solution.

Over a layer of zinc oxide on ITO glass prepared in the same manner as in Example 1, a layer of PLME of about 500 Å thickness and then a layer of H$_2$Pc of about 100 Å thickness were disposed by a vacuum vapor deposition and the solution containing polyaniline was coated thereover by spin coating to produce a polyaniline film in about 1,000 Å thickness. Gold was vapor deposited under vacuum as a back side electrode and lead wires were attached with silver paste to two electrodes.

The conversion efficiency of the device was measured as in Example 1. As a result, Voc=0.4 V, Jsc=1.95 mA/cm$^2$, ff=0.52 and 0.54% conversion efficiency were obtained.

EXAMPLE 25

3-Hexylthiophene (0.1 mol/l) and TBAP (0.1 mol/l) were dissolved in nitrobenzene and polymerized by the constant potential polymerization method using platinum as a working electrode. The thus formed poly(3-hexylthiophene) was electrochemically reduced and sufficiently washed with methanol. The polymer was dissolved in toluene to prepare a coating solution.

The solution was coated by spin coating on an ITO glass/PLME (500 Å thickness)/AlClPc (100 Å thickness) prepared in the same manner as in Example 24 to form a poly(3-hexylthiophene) layer of about 600 Å thickness. Gold was further vapor deposited as a back side electrode on the layer and the photoelectronic conversion characteristics were measured in the same manner as in Example 1. As a result, Voc=0.52 V, Jsc=2.68 mA/cm$^2$, ff=0.38 and 0.71% conversion efficiency were obtained.

What is claimed is:

1. A photovoltaic device comprising a portion containing three layers disposed between two electrodes, of which at least one of said electrodes is light transmittable; wherein said three layers consist of a first layer of organic electron acceptor material, a second layer of organic electron donor material and a third layer of organic electronic donor material different from the material of the second layer; or a first layer of organic electron donor material, a second layer of organic electron acceptor material and a third layer of organic electron acceptor material different from the acceptor material of the second layer and the sequence of the three films is arranged in this order from a light-incident side.

2. The photovoltaic device according to claim 1, wherein a wavelength region of light absorbed by said organic material of the third layer does not completely overlap with a wavelength region of light effective to form photocarriers in said organic material of the second layer.

3. The photovoltaic device according to claim 1, wherein a wavelength of a light absorption peak of said third layer differs by at least 20 nm from that of said second layer.

4. The photovoltaic device according to claim 1, wherein said organic electron donor material of the second layer comprises a phthalocyanine or a metal complex thereof.

5. The photovoltaic device according to claim 1, wherein said organic electron donor material of the third layer comprises a quinacridone series pigment.

6. The photovoltaic device according to claim 1, wherein a combination of said organic electron donor material of the second layer and said organic electron donor material of the third layer is in any one of the following combinations: phthalocyanine series pigment/quinacridone series pigment; phthalocyanine series pigment/ merocyanine compound; phthalocyanine series pigment/cyanine compound; phthalocyanine series pigment/squalium compound; indigo series pigment/quinacridone series pigment; squalium compound/quinacridone series pigment; phthalocyanine series pigment/charge transfer agent; and quinacridone series pigment/charge transfer agent.

7. The photovoltaic device according to claim 1, wherein an n-type inorganic semiconductor layer is interposed between said first layer and the electrode on a light-incident side or between said third layer and the electrode on a non-light-incident side.

8. The photovoltaic device according to claim 7, wherein said semiconductor layer interposed between the first layer and the electrode on a light-incident side is transparent.

* * * * *